United States Patent
Bunea

(10) Patent No.: US 8,796,061 B2
(45) Date of Patent: Aug. 5, 2014

(54) MODULE ASSEMBLY FOR THIN SOLAR CELLS

(71) Applicant: Gabriela Bunea, Santa Clara, CA (US)

(72) Inventor: Gabriela Bunea, Santa Clara, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 13/725,644

(22) Filed: Dec. 21, 2012

(65) Prior Publication Data

US 2014/0179050 A1 Jun. 26, 2014

(51) Int. Cl.
*H01L 21/00* (2006.01)
*H01L 31/0203* (2014.01)

(52) U.S. Cl.
CPC .................................. *H01L 31/0203* (2013.01)
USPC .......................... 438/57; 438/64; 257/E31.001

(58) Field of Classification Search
CPC ....................... H01L 31/022433; H01L 31/048
USPC ................. 438/57, 64; 257/E25.007, E31.001
See application file for complete search history.

(56) References Cited

U.S. PATENT DOCUMENTS

| | | |
|---|---|---|
| 3,961,997 A | 6/1976 | Chu |
| 4,070,097 A | 1/1978 | Gelber et al. |
| 4,084,099 A | 4/1978 | Harvey et al. |
| 4,278,831 A | 7/1981 | Riemer et al. |
| 4,427,839 A | 1/1984 | Hall |
| 4,478,879 A | 10/1984 | Baraona et al. |
| 4,496,788 A | 1/1985 | Hamakawa et al. |
| 4,509,248 A | 4/1985 | Spitzer et al. |
| 4,665,277 A | 5/1987 | Sah et al. |
| 4,927,770 A | 5/1990 | Swanson |
| 5,030,295 A | 7/1991 | Swanson et al. |
| 5,053,083 A | 10/1991 | Sinton |
| 5,057,439 A | 10/1991 | Swanson et al. |
| 5,066,340 A | 11/1991 | Iwamoto et al. |
| 5,164,019 A | 11/1992 | Sinton |
| 5,213,628 A | 5/1993 | Noguchi et al. |
| 5,217,539 A | 6/1993 | Fraas et al. |
| 5,266,125 A | 11/1993 | Rand et al. |
| 5,360,990 A | 11/1994 | Swanson |
| 5,369,291 A | 11/1994 | Swanson |
| 5,391,235 A | 2/1995 | Inoue |
| 5,447,576 A | 9/1995 | Willis |

(Continued)

FOREIGN PATENT DOCUMENTS

DE    102006048216 A1    4/2008

OTHER PUBLICATIONS

SunPower Discovers the "Surface Polarization" Effect in High Efficiency Solar Cells, Aug. 2005, pp. 1-4, Source: SunTechnics SunReader.

(Continued)

*Primary Examiner* — Daniel Whalen
(74) *Attorney, Agent, or Firm* — Okamoto & Benedicto LLP

(57) ABSTRACT

Solar cells are packaged by placing the solar cells between sheets of encapsulants. The encapsulants are exposed to ultraviolet (UV) light to cure the encapsulants and bond the encapsulants together to encapsulate the solar cells. The UV curing steps may be performed to bond one of the encapsulants to a transparent top cover and the solar cells, and to bond the other encapsulant to the solar cells and a backsheet. A protective package that includes the transparent top cover, encapsulated solar cells, and the backsheet is then optionally mounted on a frame.

13 Claims, 6 Drawing Sheets

(56) References Cited

U.S. PATENT DOCUMENTS

| | | | |
|---|---|---|---|
| 5,468,652 A | 11/1995 | Gee | |
| 5,512,757 A | 4/1996 | Cederstrand et al. | |
| 5,641,362 A | 6/1997 | Meier | |
| 5,660,646 A | 8/1997 | Kataoka et al. | |
| 5,728,230 A | 3/1998 | Komori et al. | |
| 5,918,140 A | 6/1999 | Wickboldt et al. | |
| 6,013,582 A | 1/2000 | Ionov et al. | |
| 6,096,968 A | 8/2000 | Schlosser et al. | |
| 6,118,258 A | 9/2000 | Farine et al. | |
| 6,130,379 A | 10/2000 | Shiotsuka et al. | |
| 6,143,976 A | 11/2000 | Endros | |
| 6,147,297 A | 11/2000 | Wettling et al. | |
| 6,210,991 B1 | 4/2001 | Wenham et al. | |
| 6,262,359 B1 | 7/2001 | Meier et al. | |
| 6,274,402 B1 | 8/2001 | Verlinden et al. | |
| 6,274,404 B1 | 8/2001 | Hirasawa et al. | |
| 6,278,054 B1 | 8/2001 | Ho et al. | |
| 6,311,436 B1 | 11/2001 | Mimura et al. | |
| 6,313,395 B1 | 11/2001 | Crane et al. | |
| 6,333,457 B1 | 12/2001 | Mulligan et al. | |
| 6,337,283 B1 | 1/2002 | Verlinden et al. | |
| 6,387,726 B1 | 5/2002 | Verlinden et al. | |
| 6,423,568 B1 | 7/2002 | Verlinden et al. | |
| 6,429,037 B1 | 8/2002 | Wenham et al. | |
| 6,465,724 B1 | 10/2002 | Garvison et al. | |
| 6,521,825 B2 | 2/2003 | Miura et al. | |
| 6,524,880 B2 | 2/2003 | Moon et al. | |
| 6,552,414 B1 | 4/2003 | Horzel et al. | |
| 6,692,985 B2 | 2/2004 | Huang et al. | |
| 6,777,610 B2 | 8/2004 | Yamada et al. | |
| 6,872,321 B2 | 3/2005 | Thavarajah et al. | |
| 6,998,288 B1 | 2/2006 | Smith et al. | |
| 7,135,350 B1 | 11/2006 | Smith et al. | |
| 7,217,883 B2 | 5/2007 | Munzer | |
| 7,238,594 B2 | 7/2007 | Fonash et al. | |
| 7,280,235 B2 | 10/2007 | Lapstun et al. | |
| 7,281,786 B2 | 10/2007 | Silverbrook | |
| 7,292,368 B2 | 11/2007 | Rozzi | |
| 7,306,307 B2 | 12/2007 | Lapstun et al. | |
| 7,306,325 B2 | 12/2007 | Silverbrook et al. | |
| 7,309,020 B2 | 12/2007 | Anderson et al. | |
| 7,322,669 B2 | 1/2008 | Berry et al. | |
| 7,322,673 B2 | 1/2008 | Silverbrook et al. | |
| 7,328,966 B2 | 2/2008 | Silverbrook | |
| 7,335,555 B2 | 2/2008 | Gee et al. | |
| 7,341,328 B2 | 3/2008 | Berry et al. | |
| 7,357,476 B2 | 4/2008 | Berry et al. | |
| 7,390,961 B2 | 6/2008 | Aschenbrenner et al. | |
| 7,468,485 B1 | 12/2008 | Swanson | |
| 7,517,709 B1 | 4/2009 | Borden | |
| 7,554,031 B2 | 6/2009 | Swanson et al. | |
| 7,633,006 B1 | 12/2009 | Swanson | |
| 7,786,375 B2 | 8/2010 | Swanson et al. | |
| 8,188,363 B2 | 5/2012 | Xavier et al. | |
| 2002/0020440 A1 | 2/2002 | Yoshimine et al. | |
| 2003/0070707 A1 | 4/2003 | King et al. | |
| 2003/0076649 A1 | 4/2003 | Speakman | |
| 2003/0134469 A1 | 7/2003 | Horzel et al. | |
| 2003/0178056 A1 | 9/2003 | Hikosaka et al. | |
| 2004/0200520 A1 | 10/2004 | Mulligan et al. | |
| 2004/0261840 A1 | 12/2004 | Schmit et al. | |
| 2005/0178428 A1 | 8/2005 | Laaly et al. | |
| 2005/0268963 A1 | 12/2005 | Jordan et al. | |
| 2006/0130891 A1 | 6/2006 | Carlson | |
| 2006/0157103 A1 | 7/2006 | Sheats et al. | |
| 2006/0196535 A1 | 9/2006 | Swanson et al. | |
| 2006/0201545 A1 | 9/2006 | Ovshinsky et al. | |
| 2007/0082206 A1 | 4/2007 | Hartig | |
| 2007/0151598 A1 | 7/2007 | De Ceuster et al. | |
| 2007/0269750 A1 | 11/2007 | Irving et al. | |
| 2008/0199690 A1 | 8/2008 | Hayes et al. | |
| 2008/0236655 A1* | 10/2008 | Baldwin et al. | 136/251 |
| 2009/0032087 A1 | 2/2009 | Kalejs | |
| 2009/0205712 A1 | 8/2009 | Cousins | |
| 2010/0047589 A1 | 2/2010 | Ochs et al. | |
| 2010/0075234 A1 | 3/2010 | Cousins | |
| 2010/0108128 A1 | 5/2010 | Chu et al. | |
| 2010/0139740 A1* | 6/2010 | Xavier et al. | 136/251 |
| 2010/0139764 A1 | 6/2010 | Smith | |
| 2010/0175743 A1 | 7/2010 | Gonzalez et al. | |
| 2011/0214717 A1 | 9/2011 | Halahmi et al. | |
| 2011/0272006 A1 | 11/2011 | Sainno et al. | |
| 2012/0017971 A1 | 1/2012 | Moslehi et al. | |
| 2012/0090778 A1 | 4/2012 | Cheng et al. | |
| 2012/0097218 A1* | 4/2012 | Vandal et al. | 136/251 |
| 2012/0171802 A1 | 7/2012 | Luch et al. | |

OTHER PUBLICATIONS

R. Swanson, et al., "The Surface Polarization Effect in High-Effiency Silicon Solar Cells", submitted for publication to the 15th International Photovoltaic Science and Engineering Conference & Solar Energy Exhibition, Oct. 10-15, 2005 (4 sheets), Shanghai, China.

Jianhua Zhao, et al., "Performance Instability in N-Type Pert Silicon Solar Cells", The 3rd World Conference on Photovoltaic Energy Conversion, May 12-16, 2003 (4 sheets), Osaka, Japan.

S.M. Sze "Physics of Semiconductor Devices", 1981 Second Edition, pp. 362-369, Copyright by John Wiley & Sons, Inc., U.S.

W.P. Mulligan, et al. "A Flat-Plate Concentrator: Micro-Concentrator Design Overview", 2000, 3 sheets, Proceedings of the 28th IEEE PVSC.

K. R. McIntosh, et al. "The Choice of Silicon Wafer for the Production of Low-Cost Rear-Contact Solar Cells", May 2003, 4 sheets, Sunpower Corporation, Sunnyvale, CA.

P.J. Verlinden, et al. "Will We have a 20%-Efficient(PTC) Photovoltaic System?", 2001, 6 sheets, Proceedings of the 17th Europe Photovoltaic Solar Energy Conference.

William P. Mulligan, et al. "Development of Chip-Size Silicon Solar Cells", 2000, 6 sheets, Proceedings of the 28th IEEE PVSC.

Akira Terao, et al. "A Mirror-Less Design for Micro-Concentrator Modules", 2000, 4 sheets, Proceedings of the 28th IEEE PVSC.

P.J. Verlinden, et al. "Backside-Contact Silicon Solar Cells with Improved Efficiency for the '96 World Solar Challenge", 1997, 5 sheets, Proceedings of the 15th EPSEC.

P.J. Verlinden, et al. "One-Year Comparison of a Concentrator Module with Silicon Point-Contact Solar Cell to a Fixed Flat Plate Module in Northern California", 2000, 4 sheet, Proceedings of the 16th EPSEC.

Richard M. Swanson, "The Promise of Concentrators", 2000, Prog. Photovolt. Res. Appl. 8, pp. 93-111 (2000), Sunpower Corporation, Sunnyvale, CA.

Ronald A. Sinton, et al. "Simplified Backside-Contact Solar Cells", Feb. 1990, pp. 348-352, IEEE Transactions on Electron Devices, vol. 37. No. 2.

Ronald A. Sinton, "Device Physics and Characterization of Silicon Point-Contact Solar Cells", Feb. 1997, pp. 1-154, Stanford Electronics Laboratories, Stanford University, CA.

Richard Roland King, "Studies of Oxide-Passivated Emitters in Silicon and Applications to Solar Cells", Aug. 1990, pp. 1-200, (Thesis) Electrical Engineering Department of Stanford University, CA.

Eric Fogarassy, et al. "Long-Pulse Excimer Laser Crystallization and Doping for the Fabrication of High Performance Polysilicon TFTs", Jan. 2006, pp. S40-S46, Journal of the Korean Physical Society, vol. 48.

Ted Kamins, "Polycrystalline Silicon for Integrated Circuit Applications" third printing 1994, pp. 198-199, Kluwer Academic Publishers, Norwell, Massachusetts.

J.Y. Lee, et al. "Boron-Back Surface Field With Spin-On Dopants by Rapid Thermal Processing", Jun. 2004, pp. 998-1001, 19th European Photovoltaic Solar Energy Conference, Paris, France.

B. Lee et al. "Thermally conductive and electrically insulating EVA composite encapsulants for solar photovoltaic (PV) cell", 2008, pp. 357-363, exPRESS Polymer Letters vol. 2, No. 5.

John Pern "Module Encapsulation Materials, Processing and Testing", 2008, 33 pages, NREL National Renewable Energy Laboratory.

Side chain—Wikipedia, the free encyclopedia, 1 sheet [retrieved on

(56) References Cited

OTHER PUBLICATIONS

Oct. 22, 2012], retrieved from the internet: http://en.wikipedia.org/wiki/Side_chain.

Dynamic mechanical analysis—Wikipedia, the free encyclopedia, 7 sheets [retrieved on Oct. 23, 2012], retrieved from the internet: http://en.wikipedia.org/wiki/Dynamic_mechanical_analysis.

Dynamic Mechanical Analysis Basics: Part 1 How DMA Works, 2007, pp. 1-4, Technical Note Thermal Analysis, Perkin Elmer Inc., Waltham, MA.

PCT International Search Report and Written Opinion of the International Searching Authority for Application No. PCT/US2013/075820, 7 sheets, Apr. 16, 2014.

* cited by examiner

MODULE ASSEMBLY FOR THIN SOLAR CELLS

TECHNICAL FIELD

Embodiments of the subject matter described herein relate generally to solar cells. More particularly, embodiments of the subject matter relate to solar cell modules.

BACKGROUND

Solar cells are well known devices for converting solar radiation to electrical energy. A solar cell has a front side that faces the sun to collect solar radiation during normal operation and a backside opposite the front side. Solar radiation impinging on the solar cell creates electrons and holes that migrate to diffusion regions, thereby creating voltage differentials between the diffusion regions. Metal contacts are formed to corresponding diffusion regions to allow an external electrical circuit, e.g., a load, to be connected to and be powered by the solar cell.

Solar cells may be serially connected and packaged together to form a solar cell module. The packaging provides environmental protection for the solar cells, and may include a top cover on the front side, an encapsulant that encapsulates the solar cells, and a backsheet that provides insulation on the backside. Embodiments of the present invention pertain to solar cell packaging processes that allow for accurate solar cell placement.

BRIEF SUMMARY

In one embodiment, solar cells are packaged by placing the solar cells between sheets of encapsulants. The encapsulants are exposed to ultraviolet (UV) light to cure the encapsulants and bond the encapsulants together to encapsulate the solar cells. The UV curing steps may be performed to bond one of the encapsulants to a transparent top cover and the solar cells, and to bond the other encapsulant to the solar cells and a backsheet. A protective package that includes the transparent top cover, encapsulated solar cells, and the backsheet may be, but not necessarily, mounted on a frame.

These and other features of the present invention will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures. The figures are not drawn to scale.

DETAILED DESCRIPTION

In the present disclosure, numerous specific details are provided, such as examples of components, materials, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
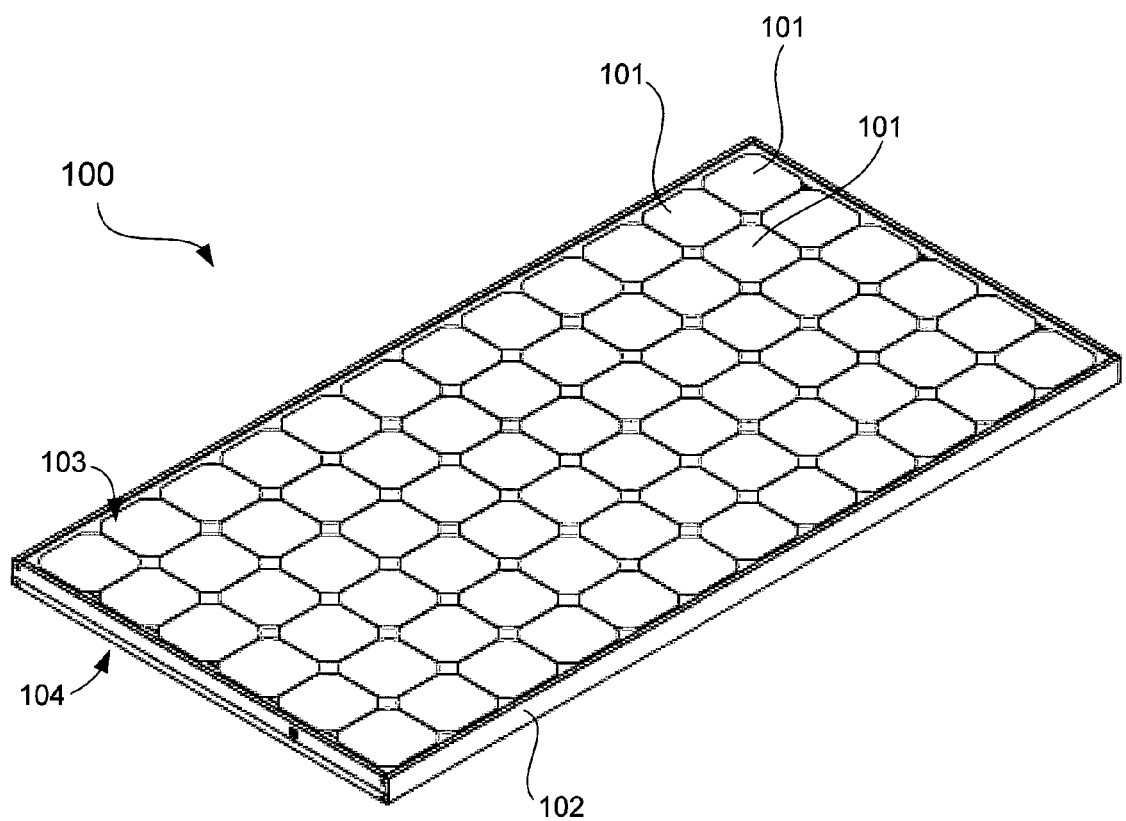
FIG. 1 shows a solar cell module in accordance with an embodiment of the present invention.

FIG. 1 shows a solar cell module 100 in accordance with an embodiment of the present invention. The solar cell module 100 is a so-called "terrestrial solar cell module" in that it is designed for use in stationary applications, such as on rooftops or by photovoltaic power plants. In the example of FIG. 1, the solar cell module 100 includes an array of interconnected solar cells 101. Only some of the solar cells 101 are labeled in FIG. 1 for clarity of illustration. In the example of FIG. 1, the solar cells 101 comprise backside contact solar cells. In a backside contact solar cell, all diffusion regions and metal contacts coupled to the diffusion regions are formed on the backside of the solar cell. That is, both the P-type and N-type diffusion regions and metal contacts coupled to them are on the backside of the solar cell. In other embodiments, the solar cells 101 may also be front side contact solar cells or other types of solar cells.

Visible in FIG. 1 are the front sides of the solar cells 101. The front sides of the solar cells 101 are also referred to as the "sun side" because they face toward the sun to collect solar radiation during normal operation. The backsides of the solar cells 101 are opposite the front sides. A frame 102 provides mechanical support for the solar cells 101. The front portion 103 of the solar cell module 100 is on the same side as the front sides of the solar cells 101 and is visible in FIG. 1. The back portion 104 of the solar cell module 100 is under the front portion 103. The back portion 104 of the solar cell module 100 is on the same side as the backsides of the solar cells 101.

FIGS. 2-5 are cross-sectional views schematically illustrating a method of making a solar cell module 100 in accordance with an embodiment of the present invention. FIGS. 2-5 are not drawn to scale.

Figure 2:
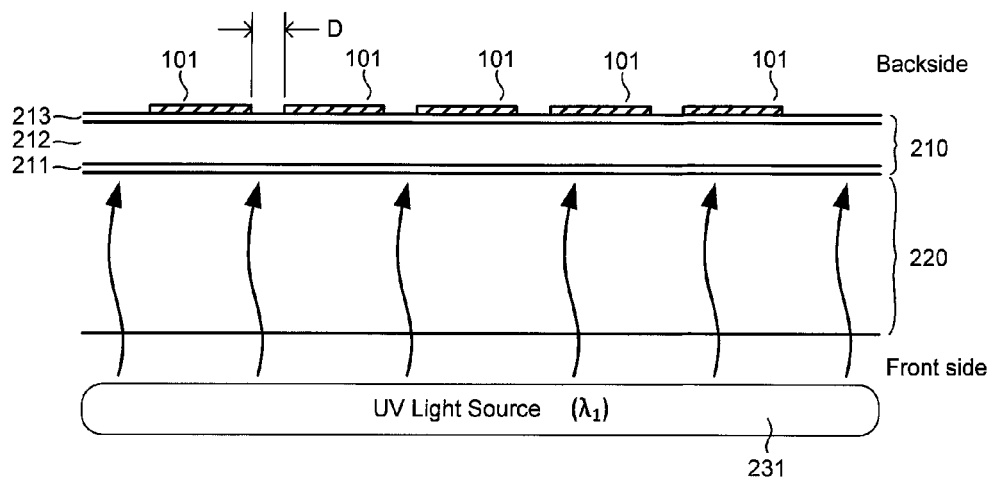
FIGS. 2-5 are cross-sectional views schematically illustrating a method of making the solar cell module of FIG. 1 in accordance with an embodiment of the present invention.

In the example of FIG. 2, a sheet of an encapsulant 210 is placed on a transparent top cover 220. In one embodiment, the transparent top cover 220 comprises glass that has a thickness between 1 mm to 4 mm, e.g., 3.2 mm. The solar cells 101 are placed on the encapsulant 210. The solar cells 101 are placed in alignment with their front sides facing toward the encapsulant 210. The solar cells 101 may be placed relative to one another at a distance D to within 50 μm to 100 μm accuracy, for example. The solar cells 101 may be electrically serially connected by interconnect metals formed on the backsides of the solar cells 101 (e.g., interconnect metals 251 shown in FIG. 5).

The encapsulant 210 may comprise a multilayer encapsulant. In the example of FIG. 2, the encapsulant 210 comprises an encapsulant layer 211, an encapsulant layer 212, and an encapsulant layer 213. The encapsulant layer 211 may have a thickness of 25 μm to 50 μm, the encapsulant layer 212 may have a thickness of 250 μm, and the encapsulant layer 213 may have a thickness of 25 μm to 50 μm. The thicknesses of the encapsulant layers may vary depending on the particulars of the implementation. The encapsulant layer 211 may include additives that allow it to bond to the transparent top cover 220 upon curing. Similarly, the encapsulant layer 213 may include additives that allow it to bond to the solar cells 101 upon curing.

The encapsulant 210 may comprise a light curable encapsulant. In one embodiment, the encapsulant 210 is curable by exposure to ultraviolet (UV) light. In one embodiment, the encapsulant layer 211 may be cured to bond to the glass transparent top cover 220 by exposure to UV light of a first wavelength $\lambda_1$, and the encapsulant layer 213 may be cured to bond to the solar cells 101 by exposure to UV light of a second wavelength $\lambda_2$. The encapsulant 210 may comprise of modified polyolefin encapsulant that protectively encapsulates solar cells. The polyolefin has less than five weight percent of oxygen and nitrogen in the backbone or side chain. In other words, the combined weight percent of oxygen and nitrogen in any location in the molecular structure of the polyolefin is less than five. The UV cure wavelength range is 300 nm to 400 nm.

In the example of FIG. 2, a UV light source 231 emits high intensity UV light of a first wavelength $\lambda_1$, and faces the front sides of the solar cells 101. The UV light emitted by the UV light source 231 enters from and through the transparent top cover 220 to shine on the encapsulant layer 211, thereby exposing the encapsulant layer 211 to the UV light. The UV light cures the encapsulant layer 211, bonding the transparent top cover 220 to the encapsulant layer 211.

Figure 3:
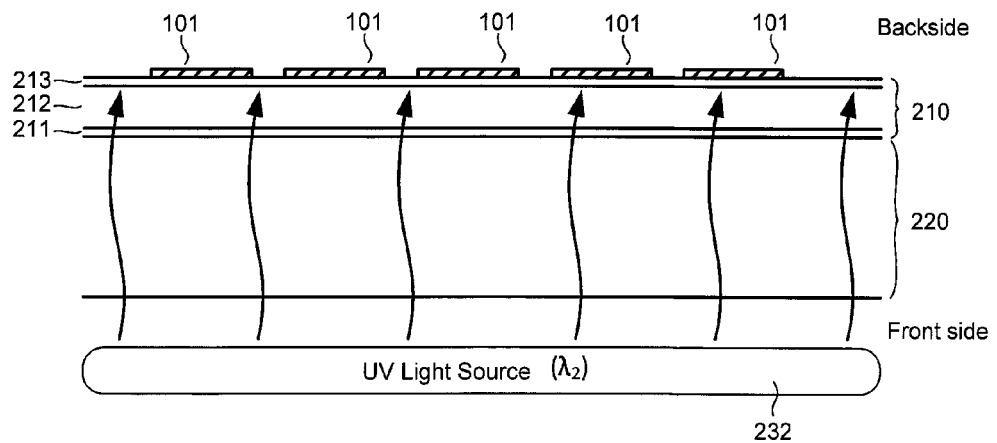

In the example of FIG. 3, a UV light source 232 emits high intensity UV light of a second wavelength $\lambda_2$, and also faces the front sides of the solar cells 101. The UV light emitted by the UV light source 232 enters from and through the transparent top cover 220, and through the encapsulant layers 211 and 212 to shine on the encapsulant layer 213, thereby exposing the encapsulant layer 213 to the UV light. The UV light cures the encapsulant layer 213, bonding the solar cells 101 to the encapsulant layer 213.

The UV light sources 232 and 231 may comprise different light sources or the same light source that is configurable to emit UV light of different wavelengths. In a manufacturing environment, the transparent top cover 220 may be placed on a platform, such a workbench or conveyor, with a cutout to allow light to illuminate the transparent top cover 220 from underneath the platform. The encapsulant 210 is placed on top of the transparent top cover 220. The solar cells 101 are thereafter accurately placed on the encapsulant 210 (e.g., using a robot). Once the transparent top cover, the encapsulant 210, and the solar cells 101 are stacked, the UV light sources 231 and 232 placed underneath the platform are turned on one after another to perform the above-described UV curing steps to cure the encapsulant 210. The order the layers of the encapsulant 210 is cured may be varied depending on the particulars of the manufacturing process.

Figure 4:
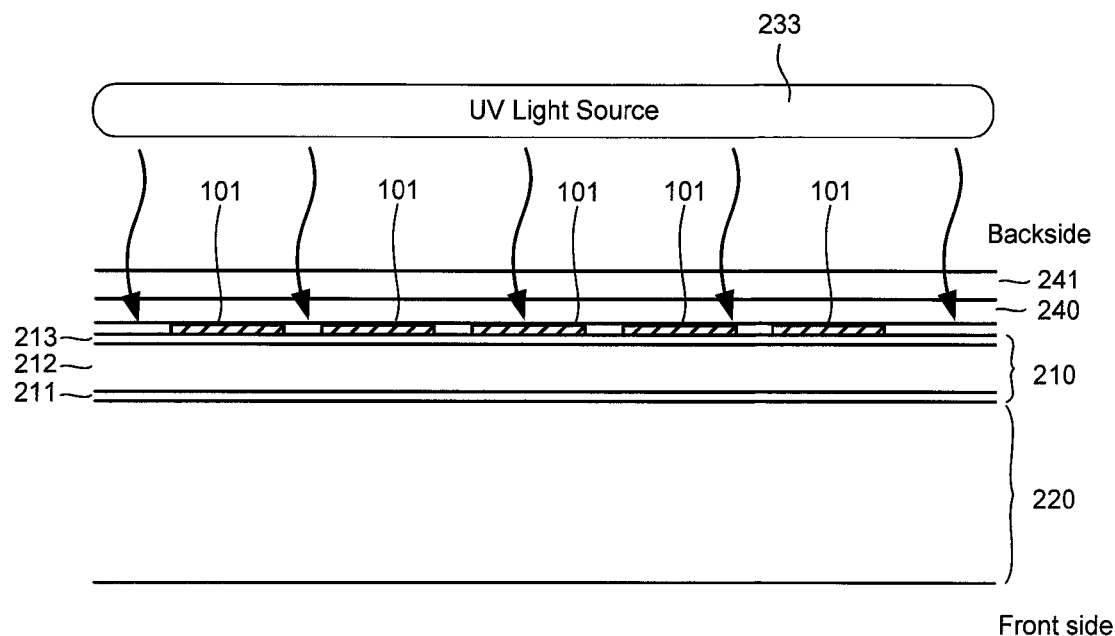

Continuing with FIG. 4, a sheet of an encapsulant 240 is placed on the backsides of the solar cells 101, and a backsheet 241 is placed on the encapsulant 241. The backsheet 241 may comprise a single layer or multiple layers of materials that provide environmental protection to other components of the solar cell module. The backsheet 241 may comprise, for example, a flouropolymer, polyvinylidene fluoride, polytetrafluoroethylene, polypropylene, polyphenylene sulfide, polyester, polycarbonate, or polyphenylene oxide.

The encapsulant 240 may comprise a single or multilayer UV curable encapsulant. In one embodiment, the encapsulant 240 comprises modified polyolefin that has less than five weight percent of oxygen and nitrogen in the backbone or side chain. In other words, the combined weight percent of oxygen and nitrogen in any location in the molecular structure of the polyolefin is less than five.

In the example of FIG. 4, a UV light source 233 emits high intensity UV light, and faces the backsides of the solar cells 101. The particular wavelength of the UV light emitted by the UV light source 233 depends on the compositions of the encapsulant 240 and the backsheet 241. The UV light source 233 emits UV light that enters from and through the backsheet 241 to shine on the encapsulant 240, thereby exposing the encapsulant 240 to the UV light. The UV light cures the encapsulant 240, thereby bonding the solar cells 101 to the encapsulant 240 and bonding the encapsulants 240 and 210 together to encapsulate the solar cells 101.

In the above-described manufacturing environment example, the UV light source 233 may be placed over the platform that supports the solar cell module being manufactured. The encapsulant 240 is placed on backsides of the solar cells 101, and the backsheet 241 is placed on the encapsulant 240. The UV light source 233 is thereafter activated to cure the encapsulant 210 to form a protective package comprising the top cover 220, the encapsulated solar cells 101, and the backsheet 241.

Because the UV curing steps employ light rather than heat, the stack of materials comprising the transparent top cover 220, the encapsulants 210 and 240, and the backsheet 241 does not warp during curing. This allows for relatively accurate placement of the solar cells 101. The low temperatures involved in UV curing also help prevent delamination of the protective package. In particular, while UV curing steps may be performed at the general ambient temperature of the factory (such as, for example, between 18° C. to 28° C.), vacuum roll lamination and other thermal processes typically employed to form protective packages for solar cell modules are performed at temperatures over 100° C.

Figure 5:
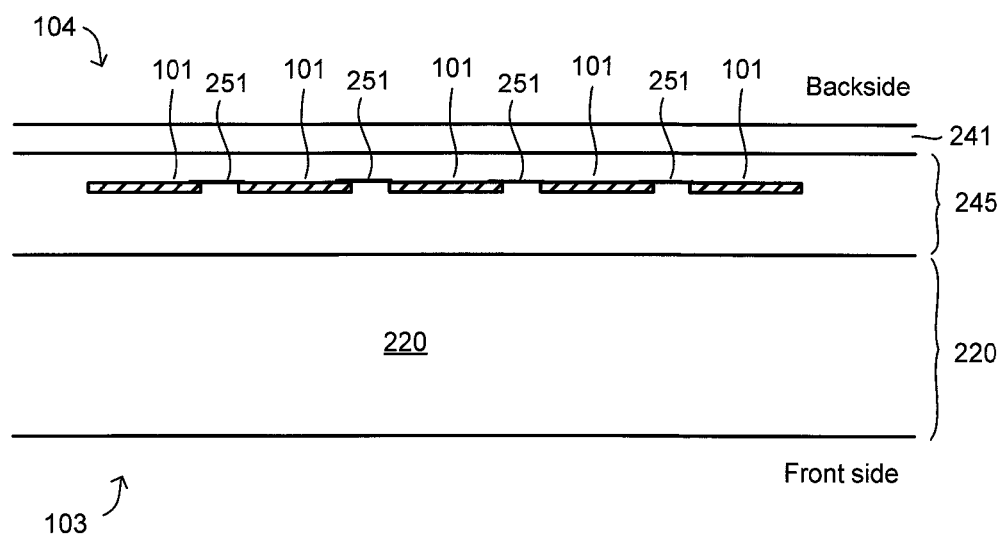

In the example of FIG. 5, the encapsulants 240 and 210 are collectively labeled as encapsulant 245 after the above-described UV curing steps. FIG. 5 also shows the interconnect metals 251 that electrically connect the solar cells 101 on the backside. The resulting protective package comprising the transparent top cover 220, the encapsulant 245, and the backsheet 241 is optionally mounted on the frame 102 (see FIG. 1) to form the solar cell module 100. As framed, the transparent top cover 220 is on the front portion 103, and the backsheet 241 is on the back portion 104.

Once the portions of the encapsulant 210 that are in contact with the top cover 220 and solar cells 101 are UV cured and the portions of the encapsulant 240 that are in contact with the solar cells 101 and the backsheet 241 are UV cured, subsequent thermal processing may be performed without disturbing the spacing of the solar cells 101. This is because the UV curing of the encapsulants 210 and 240 fixes the spacing of the solar cells 101, even when the top cover 220 bows in a later thermal processing step, such as final curing of the core of the module in a laminator or oven reflow.

Figure 6:
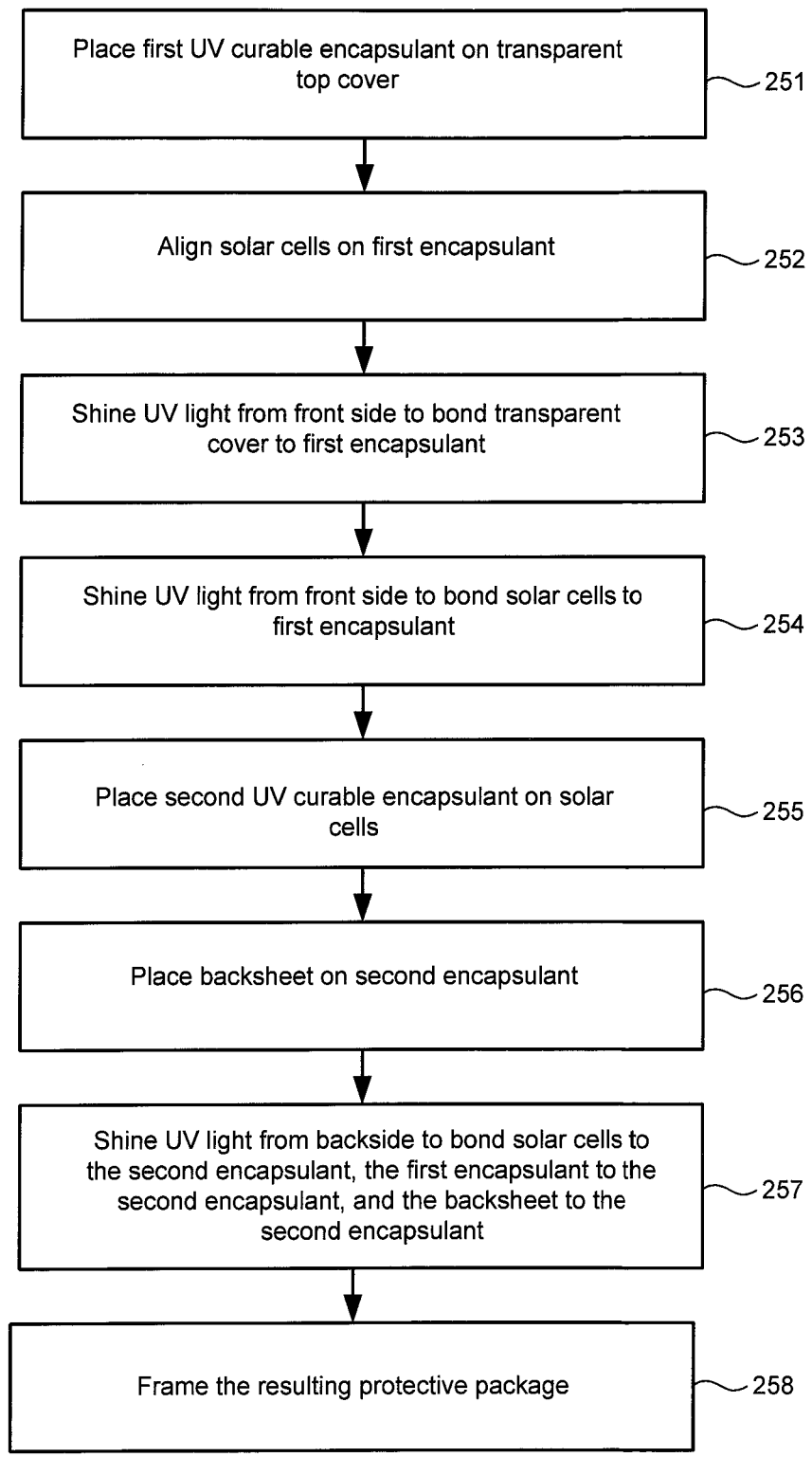
FIG. 6 shows a flow diagram of a method of making a solar cell module in accordance with an embodiment of the present invention.

FIG. 6 shows a flow diagram of a method of making a solar cell module in accordance with an embodiment of the present invention. In the example of FIG. 6, a first UV curable encapsulant is placed on a transparent top cover, which comprises glass in this example (step 251). Solar cells are then placed in alignment on the first UV curable encapsulant, with the front sides of the solar cells toward the first UV curable encapsulant (step 252). UV light is emitted toward the front sides of the solar cells, entering through the transparent cover and shining on the first UV curable encapsulant, thereby curing the first UV curable encapsulant to bond the transparent top cover to the first UV curable encapsulant (step 253). UV light is again emitted toward the front sides of the solar cells, entering through the transparent cover and shining on the first UV curable encapsulant, thereby curing the first UV curable encapsulant to bond the solar cells to the first UV curable encapsulant (step 254).

After curing the first UV curable encapsulant, a second UV curable encapsulant is placed on the backsides of the solar cells (step 255). A backsheet is thereafter placed on the second UV curable encapsulant (step 256). UV light is emitted toward the backsides of the solar cells, entering through the backsheet and shining on the second UV curable encapsulant, thereby curing the second UV curable encapsulant to bond the solar cells to the second UV curable encapsulant, to bond the first and second UV curable encapsulants together and encapsulate the solar cells, and to bond the backsheet to the second UV curable encapsulant (step 257). The resulting protective package is then optionally mounted on a frame (step 258).

Figure 7:
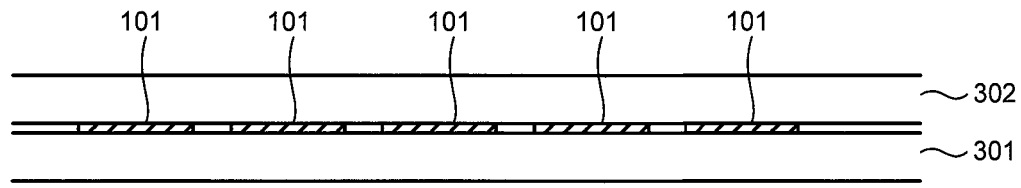
FIGS. 7-9 are cross-sectional views schematically illustrating a method of making the solar cell module of FIG. 1 in accordance with another embodiment of the present invention.
Figure 8:
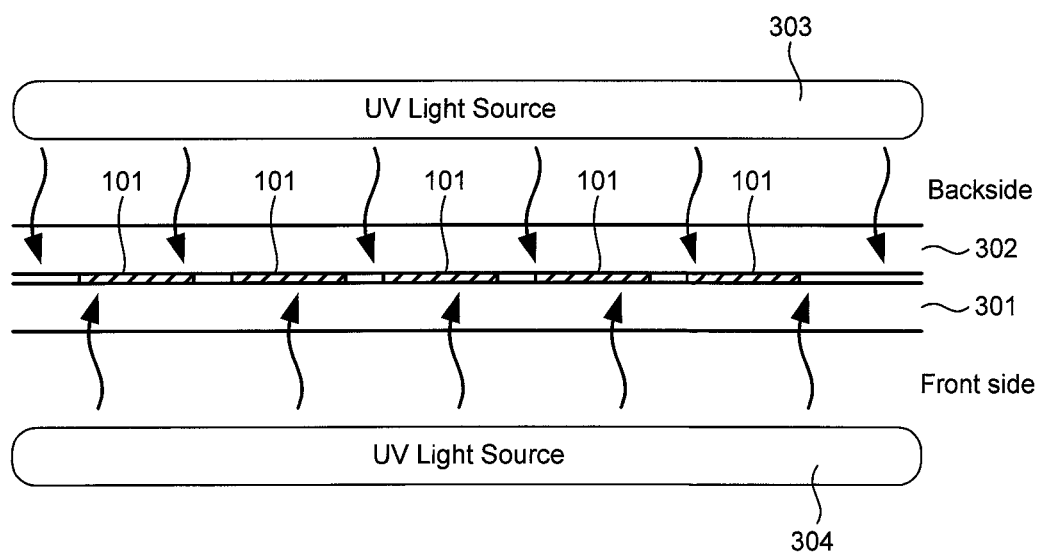
Figure 9:
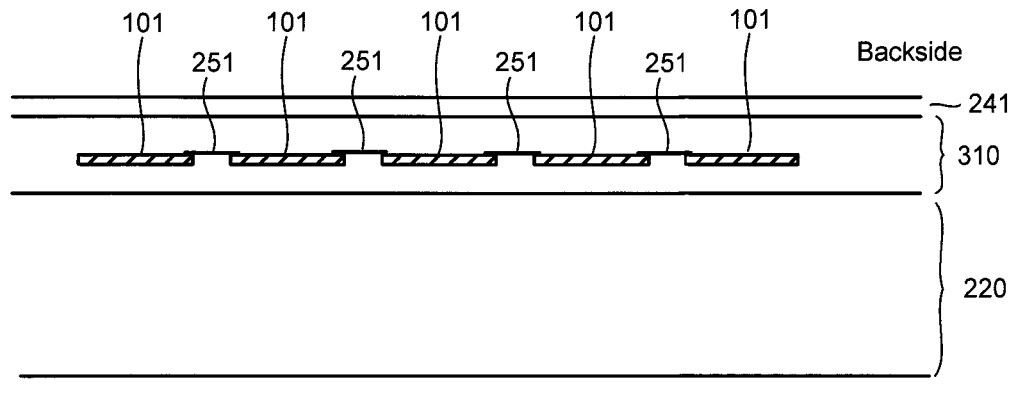

FIGS. 7-9 are cross-sectional views schematically illustrating a method of making a solar cell module 100 in accordance with another embodiment of the present invention. FIGS. 7-9 are not drawn to scale.

In the example of FIG. 7, the solar cells 101 are placed between sheets of UV curable encapsulants namely, encapsulants 301 and 302. The encapsulants 301 and 302 may comprise a single or multilayer UV curable encapsulant. The encapsulants 301 and 302 may comprise modified polyolefin that has less than five weight percent of oxygen and nitrogen in the backbone or side chain. In other words, the combined weight percent of oxygen and nitrogen in any location in the molecular structure of the polyolefin is less than five. In the example of FIG. 7, the encapsulant 301 is on the front sides of the solar cells 101, and the encapsulant 302 is on the backsides of the solar cells 101.

In the example of FIG. 8, a UV light source 303 emits UV light toward the backsides of the solar cells 101, and a UV light source 304 emits UV light toward the front sides of the solar cells 101. The particular wavelengths of the UV light emitted by the UV light sources 303 and 304 depend on the composition of the encapsulants 301 and 302. The UV light emitted by the UV light source 303 cures the encapsulant 302, and the UV light emitted by the UV light source 304 cures the encapsulant 301. The UV curing bonds the encapsulants 302 and 301 together to encapsulate the solar cells 101. As can be appreciated, the encapsulants 302 and 301 may be cured together in a same UV curing step or separately in separate UV curing steps.

In the example of FIG. 9, the encapsulants 301 and 302 are collectively labeled as an encapsulant 310 to indicate that the UV curing steps bonded the encapsulants 301 and 302 together to encapsulate the solar cells 101. FIG. 9 also shows the interconnect metals 251 that electrically connect the solar cells 101. As can be appreciated, the solar cells 101 are in fixed alignment relative to one another once they are encapsulated. Therefore, subsequently performed thermal processing steps will have little to no effect on the placement of the solar cells 101.

Figure 10:
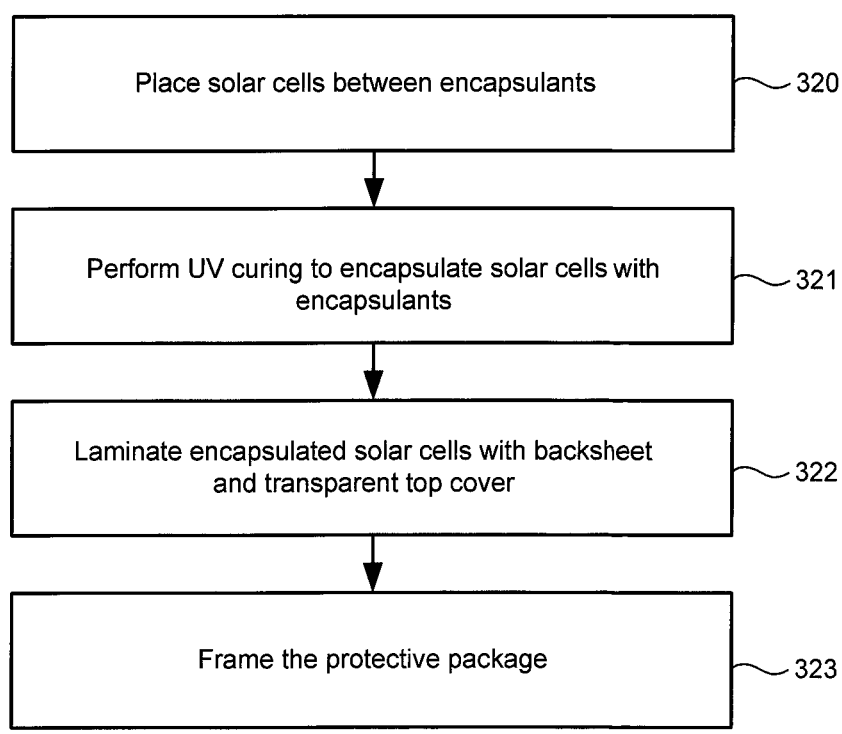
FIG. 10 shows a flow diagram of a method of making a solar cell module in accordance with another embodiment of the present invention.

In the example of FIG. 9, the encapsulant 310 encapsulating the solar cells 101 is placed on the transparent top cover 220, which comprises glass in this example. The encapsulant 310 is placed such that the front sides of the solar cells 101 face toward the transparent top cover 220. The backsheet 241 is placed on the encapsulant 310, facing toward the backsides of the solar cells 101. The transparent top cover 220, the encapsulant 310, and the backsheet 241 may thereafter be laminated together to form a protective package. For example, the protective package may be formed by vacuum roll lamination. Although the lamination process involves heating to temperatures over 100° C., the lamination process does not affect the alignment of the solar cells 101 relative to one another because the solar cells 101 are encapsulated before the lamination process. The protective package comprising the transparent top cover 220, the encapsulant 310, and the backsheet 241 is then optionally mounted on a frame. FIG. 10 shows a flow diagram of a method of making a solar cell module in accordance with another embodiment of the present invention. In the example of FIG. 10, solar cells are placed between sheets of UV curable encapsulants (step 320). One or more UV curing steps involving exposure of the encapsulants to UV light are performed to cure the UV curable encapsulants, thereby bonding the encapsulants together to encapsulate the solar cells (step 321). The encapsulated solar cells are then laminated together with a backsheet and a transparent top cover to form a protective package (step 322). For example, the encapsulated solar cells, the backsheet, and the transparent top cover may be laminated together by vacuum roll lamination. The protected package is thereafter optionally mounted on a frame to complete the solar cell module (step 323).

Techniques for packaging solar cells for solar cell modules have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of making a solar cell module, the method comprising:
    placing a first encapsulant on a transparent top cover;
    placing front sides of a plurality of solar cells on the first encapsulant, the front sides of the solar cells facing the sun to collect solar radiation during normal operation;
    curing the first encapsulant to bond the transparent top cover to the first encapsulant by exposing the first encapsulant to ultraviolet (UV) light through the transparent top cover in a first curing step; and
    curing the first encapsulant to bond the plurality of solar cells to the first encapsulant by exposing the first encapsulant to UV light through the transparent top cover in a second curing step, wherein the second curing step is different from the first curing step.

2. The method of claim 1 wherein curing the first encapsulant to bond the plurality of solar cells to the first encapsulant cures a second layer of the first encapsulant to bond the plurality of solar cells to the second layer of the first encapsulant.

3. The method of claim 1 wherein curing the first encapsulant to bond the transparent top cover to the first encapsulant cures a first layer of the first encapsulant to bond the transparent top cover to the first layer of the first encapsulant.

4. The method of claim 1 further comprising:
    placing a second encapsulant on backsides of the plurality of solar cells, the backsides being opposite the front sides;
    placing a backsheet on the second encapsulant; and
    curing the second encapsulant to bond the first and second encapsulants together to encapsulate the plurality of cells by exposing the second encapsulant to UV light through the backsheet.

5. The method of claim 4 wherein the curing of the second encapsulant also bonds the backsheet to the second encapsulant.

6. The method of claim 5 further comprising:
mounting a protective package on a frame, the protective package comprising the plurality of solar cells encapsulated by the first and second encapsulants, the transparent top cover, and the backsheet.

7. The method of claim 1 wherein the plurality of solar cells comprises backside contact solar cell.

8. The method of claim 1 wherein the transparent top cover comprises glass.

9. A method of making a solar cell module, the method comprising:
curing a first encapsulant with ultraviolet (UV) light in a first curing step to bond a transparent top cover to the first encapsulant;
curing the first encapsulant with UV light in a second curing step to bond a plurality of solar cells to the first encapsulant, wherein the second curing step is different from the first curing step;
curing a second encapsulant with UV light in a third curing step to bond the first and second encapsulants together and encapsulate the plurality of solar cells; and
mounting a protective package comprising the encapsulated plurality of solar cells, the transparent top cover, and a backsheet onto a frame.

10. The method of claim 9 wherein curing the second encapsulant with UV light in the third curing step bonds the backsheet to the second encapsulant.

11. The method of claim 9 wherein curing the first encapsulant with UV light in the first curing step bonds a first layer of the first encapsulant to the transparent top cover.

12. The method of claim 11 wherein curing the first encapsulant with UV light in the second curing step bonds a second layer of the first encapsulant to the plurality of solar cells.

13. The method of claim 9 wherein the transparent top cover comprises glass.

* * * * *